(12) United States Patent
Chen et al.

(10) Patent No.: US 8,413,036 B2
(45) Date of Patent: Apr. 2, 2013

(54) PSEUDORANDOM BINARY SEQUENCE CHECKER WITH CONTROL CIRCUITRY FOR END-OF-TEST CHECK

(75) Inventors: Si Ruo Chen, Wuhan (CN); Hao Li, Shanghai (CN); Jin Song Liu, Shanghai (CN); Tao Wang, Shanghai (CN)

(73) Assignee: Agere Systems LLC, Allentown, PA (US)

( * ) Notice: Subject to any disclaimer, the term of this patent is extended or adjusted under 35 U.S.C. 154(b) by 1078 days.

(21) Appl. No.: 12/324,920

(22) Filed: Nov. 28, 2008

(65) Prior Publication Data

US 2010/0138729 A1      Jun. 3, 2010

(51) Int. Cl.
G06F 7/02       (2006.01)
G06F 11/22      (2006.01)
G06F 17/50      (2006.01)
H03M 13/00      (2006.01)

(52) U.S. Cl. ........................................ 714/819; 716/136
(58) Field of Classification Search .................. 714/819; 716/136
See application file for complete search history.

(56) References Cited

U.S. PATENT DOCUMENTS

| | | | | |
|---|---|---|---|---|
| 5,414,713 A * | 5/1995 | Waschura et al. | ............. | 714/715 |
| 5,428,624 A * | 6/1995 | Blair et al. | .................... | 714/727 |
| 5,485,467 A * | 1/1996 | Golnabi | ........................ | 714/733 |
| 5,757,811 A * | 5/1998 | Kenmoku et al. | ............. | 714/703 |
| 5,925,144 A * | 7/1999 | Sebaa | ............................ | 714/733 |
| 6,424,628 B1 * | 7/2002 | Johnstone et al. | ............. | 370/241 |
| 6,636,994 B1 * | 10/2003 | Waschura et al. | ............. | 714/704 |
| 6,799,287 B1 * | 9/2004 | Sharma et al. | .................. | 714/703 |
| 7,073,117 B1 * | 7/2006 | Ireland et al. | .................. | 714/786 |
| 7,159,145 B2 * | 1/2007 | Wang et al. | ...................... | 714/36 |
| 7,219,113 B2 * | 5/2007 | Bonaccio et al. | ............. | 708/250 |
| 7,350,124 B2 * | 3/2008 | Gloekler et al. | ............. | 714/741 |
| 7,366,939 B2 * | 4/2008 | Le et al. | ........................ | 713/400 |
| 2005/0193290 A1 * | 9/2005 | Cho et al. | ....................... | 714/710 |

* cited by examiner

Primary Examiner — Joseph D Torres
(74) Attorney, Agent, or Firm — Ryan, Mason & Lewis, LLP

(57) ABSTRACT

Control circuitry is coupled between an error event output and a data input of a pseudorandom binary sequence (PRBS) checker. The control circuitry is configured to switch between a first operating state in which a received PRBS signal is applied to the data input of the PRBS checker and a second operating state in which an error signal is applied to the data input of the PRBS checker, responsive to detection of a designated condition of the PRBS checker. In an illustrative embodiment, the designated condition is an end-of-test condition indicating that the PRBS checker has completed a test involving the received PRBS signal.

21 Claims, 3 Drawing Sheets

US 8,413,036 B2

PSEUDORANDOM BINARY SEQUENCE CHECKER WITH CONTROL CIRCUITRY FOR END-OF-TEST CHECK

FIELD OF THE INVENTION

The present invention relates generally to electronic circuitry, and more particularly to electronic circuitry for performing tests involving a pseudorandom binary sequence (PRBS).

BACKGROUND OF THE INVENTION

A PRBS may be utilized to check for data integrity in a wide variety of applications, including telecommunication system testing and integrated circuit design and verification. For example, in a telecommunication system application, a PRBS may be generated and transmitted from a transmitter to a receiver of the system. The receiver recovers the PRBS and applies it to a PRBS checker, which determines if there are any errors in the received PRBS. The PRBS generator and the PRBS checker are both typically implemented using a circuitry arrangement known as a linear feedback shift register (LFSR). The LFSR in the PRBS checker is configured to passively monitor the received PRBS and to report error events when it observes particular changes in its internal state.

A number of significant problems can arise when using conventional PRBS checkers. For example, important error events may be inadvertently missed under some circumstances in a conventional PRBS checker. One such circumstance involves loss of clock to the PRBS checker. A clock signal is usually recovered from received PRBS data or otherwise supplied externally to the PRBS checker. If the clock signal is lost at a time when the PRBS checker is reporting an error-free condition, the PRBS checker may remain stuck in that mode, thereby potentially missing subsequent errors in the received PRBS.

Another potential problem relates to the complexity of the interface between the PRBS checker and external circuitry. As the number and type of events to be reported by the PRBS checker increase, the complexity of the interface increases, which can negatively impact circuit size and cost. The complexity of the interface can also lead to inefficiency in the reporting and processing of events. For example, during an initialization process or other situation in which the input data to the PRBS checker may be unstable, events may be reported at an excessive rate, which can negatively impact performance.

Accordingly, a need exists for an improved PRBS checking arrangement which can avoid missed errors such as those associated with loss of clock, without substantially increasing the complexity of the interface between the PRBS checker and external circuitry.

SUMMARY OF THE INVENTION

The present invention in one or more illustrative embodiments provides PRBS circuitry implementing an additional end-of-test check capability that is complementary to the conventional functionality of a PRBS checker.

In accordance with one aspect of the invention, control circuitry is coupled between an error event output and a data input of a PRBS checker. The control circuitry is configured to switch between a first operating state in which a received PRBS signal is applied to the data input of the PRBS checker and a second operating state in which an error signal is applied to the data input of the PRBS checker, responsive to detection of a designated condition of the PRBS checker. The designated condition may be an end-of-test condition indicating that the PRBS checker has completed a test involving the received PRBS signal.

In an illustrative embodiment, the control circuitry comprises a multiplexer or other switching element having a first input adapted to receive the PRBS signal, a second input adapted to receive the error signal, and an output coupled to the data input of the PRBS checker. The control circuitry further comprises control logic having an input coupled to the error event output of the PRBS checker and an output coupled to a control input of the multiplexer or other switching element.

In this embodiment, the control circuitry is configured to indicate that a test involving the received PRBS signal has passed if the test has met its in-test passage criteria and subsequent to completion of the test an expected error event is detected at the error event output of the PRBS checker after the control circuitry has switched from the first operating state in which the received PRBS signal is applied to the data input of the PRBS checker to the second operating state in which the error signal is applied to the data input of the PRBS checker. Similarly, the control circuitry is configured to indicate that a test involving the received PRBS signal has failed if the test has met its in-test passage criteria and subsequent to completion of the test the expected error event is not detected at the error event output of the PRBS checker after the control circuitry has switched from the first operating state in which the received PRBS signal is applied to the data input of the PRBS checker to the second operating state in which the error signal is applied to the data input of the PRBS checker.

The output event interface of the PRBS checker in this embodiment includes an out-of-sync event output but does not include an in-sync event output. Thus, the PRBS checker may comprise only a single error event output.

The control circuitry or other PRBS circuitry configured in accordance with the invention may be implemented, for example, in a testing system, in a given node of a telecommunication system, or in an integrated circuit.

Advantageously, the illustrative embodiments can readily determine if a PRBS checker is stuck in a particular state due to loss of its clock signal. Also, the output event interface of the PRBS checker is simplified, leading to reduced complexity and cost, as well as improved system performance.

DETAILED DESCRIPTION OF THE INVENTION

The invention will be illustrated herein in conjunction with exemplary testing systems and associated PRBS circuitry that may be utilized in a wide variety of electronic testing applications, including those involving telecommunication system testing and integrated circuit design and verification. It should be understood, however, that the PRBS testing arrangements of the present invention can be implemented using other types of circuitry than that specifically shown and described in conjunction with the illustrative embodiments.

Figure 1:
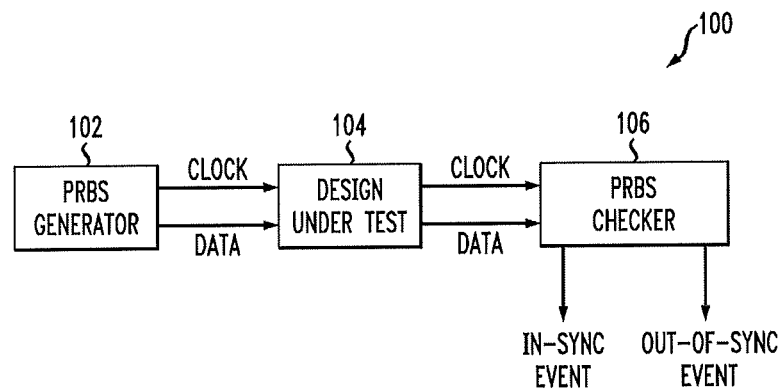
FIG. 1 is a block diagram of an electronic testing system incorporating PRBS circuitry that may be modified in accordance with an illustrative embodiment of the invention.

FIG. 1 shows an electronic testing system 100 comprising a PRBS generator 102, a design under test 104, and a PRBS checker 106. Clock and data signals are supplied from the PRBS generator 102 to the design under test 104. The design under test supplies corresponding clock and data signals as inputs to the PRBS checker 106, which has error event outputs that identify respective in-sync and out-of-sync events. Elements 102 and 106 may be viewed individually or collectively as examples of what is more generally referred to herein as "PRBS circuitry." Such PRBS circuitry may include conventional elements typically found in PRBS circuitry, such as LFSRs, buffer circuits, clock recovery circuits, processors, memory, etc.

The design under test may comprise, for example, a telecommunication device, an integrated circuit, or other type of device to be tested by the system. The design under test need not be an actual physical device, and could instead be implemented at least in part in the form of software. For example, the test system may be configured for verification of an integrated circuit design that has not yet been implemented as a physical device. The design under test in a testing system of the present invention therefore need not take on any particular form, and may comprise hardware, firmware or software, or various combinations thereof.

In operation, a PRBS signal having a particular pattern is generated in generator 102 and then supplied to the design under test 104 where it is further processed. The PRBS checker 106 determines whether the pattern of the PRBS signal it receives from the design under test matches the particular pattern of the PRBS signal as generated by generator 102. After detecting a certain number of consecutive pattern matches, the PRBS checker 106 reports an in-sync event at one of its outputs. This indicates that the design under test is operating properly and preserving the original PRBS patterns. On the other hand, if a certain number of consecutive mismatches are detected, the PRBS checker reports an out-of-sync event at another one of its outputs. This indicates that some aspect of the processing in the design under test is causing its output PRBS patterns to deviate from those provided to it by the generator. The testing system 100 thus serves to test the functionality of the design under test 102 using PRBS patterns generated by the generator 102 and checked by the PRBS checker 106.

In this embodiment, the PRBS generator 102 supplies clock and data signals to the design under test 104 and the design under test supplies corresponding clock and data signals to the PRBS checker 106. The data signals comprise the PRBS patterns mentioned above. In other embodiments, the PRBS checker may be configured to recover the clock signal from the received PRBS data signal.

As mentioned previously, the loss of clock can cause a PRBS checker to miss errors in a received PRBS signal. For example, in the FIG. 1 embodiment, if the PRBS checker 106 is reporting an in-sync event when the clock signal is lost, it may remain stuck in that mode, thereby potentially missing subsequent errors in the received PRBS. Also, the PRBS checker includes outputs for both in-sync and out-of-sync events, and such outputs can be triggered at an unduly high rate, particularly during an initialization process or other situation in which the input data to the PRBS checker may be unstable.

Figure 2:
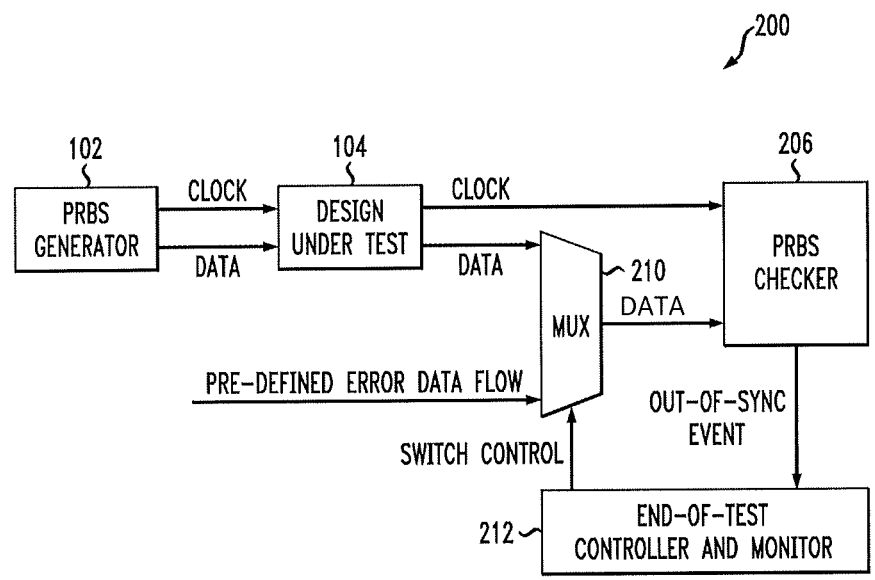
FIG. 2 is a block diagram of a system with PRBS circuitry configured in accordance with an illustrative embodiment of the invention.

FIG. 2 illustrates the manner in which the system of FIG. 1 is modified in an illustrative embodiment of the invention to address the loss of clock and output interface issues noted above. In this embodiment, electronic testing system 200 comprises the PRBS generator 102 and design under test 104 as previously described. The PRBS checker 106 of the FIG. 1 system is replaced in this embodiment with a modified PRBS checker 206 that has only an out-of-sync event output, and no in-sync event output. The out-of-sync event output is an example of what is more generally referred to herein as an "error event output."

The system 200 further comprises control circuitry coupled between the out-of-sync event output and the data input of the PRBS checker 206. As will be described, the control circuitry is configured to switch between a first operating state in which a received PRBS signal is applied to the data input of the PRBS checker and a second operating state in which a predetermined error signal is applied to the data input of the PRBS checker, responsive to detection of a designated condition of the PRBS checker.

The control circuitry of the FIG. 2 embodiment thus implements an end-of-test check that is complementary to the normal operation of the PRBS checker 206. This end-of-test check can detect errors that are associated with loss of clock in the PRBS checker while also simplifying the output interface of the PRBS checker.

The control circuitry in this embodiment more particularly comprises a multiplexer 210 and an end-of-test controller and monitor 212. The multiplexer 210 is an example of what is more generally referred to herein as a "switching element," and the end-of-test controller and monitor 212 is an example of what is more generally referred to herein as "control logic." The multiplexer has a first input adapted to receive the PRBS signal from the design under test 104, and a second input adapted to receive a predetermined error signal. The predetermined error signal in this embodiment is more particularly identified in the figure as a pre-defined error data flow. The output of the multiplexer 210 is coupled to the data input of the PRBS checker 206. The end-of-test controller and monitor 212 has an input coupled to the error event output of the PRBS checker and an output coupled to a control input of the multiplexer.

The control circuitry comprising multiplexer 210 and end-of-test controller and monitor 212 is configured to switch between the first operating state in which a received PRBS signal is applied to the data input of the PRBS checker 206 and the second operating state in which the predetermined error signal is applied to the data input of the PRBS checker responsive to detection of an end-of-test condition of the PRBS checker. The end-of-test condition generally indicates that the PRBS checker has completed a test involving the received PRBS signal. For example, an end-of-test indicator may be generated by additional circuitry external to the PRBS checker and supplied to element 212. Such additional external circuitry is not shown in the figure. As one more particular example, an end-of-test indicator may be generated in external test circuitry responsive to a command entered by a test engineer.

Other techniques for detecting the end of a given test in the PRBS checker may be used. For example, it is possible in an alternative embodiment that an end-of-test indicator may be generated by the end-of-test controller and monitor or by the PRBS checker. It is also possible that a given end-of-test indicator may be generated just prior to completion of a corresponding test, rather than simultaneous with or subsequent to completion of the given test. The test for which the end-of-test indicator is generated may be a particular designated portion of a more extensive test involving the PRBS circuitry of the system.

In order to test a given PRBS signal, the multiplexer 210 is configured under the control of the end-of-test controller and monitor 212 to supply the PRBS data from the design under test 104 to the data input of the PRBS checker 206. When the test is complete, the multiplexer 210 is configured under the control of the end-of-test controller and monitor 212 to supply the pre-defined error data flow to the data input of the PRBS checker 206.

The pre-defined error data flow is configured in the present embodiment so as to cause an out-of-sync event if the PRBS checker 206 has not lost its clock and is otherwise operating properly. The end-of-test controller and monitor 212 thus monitors the out-of-sync event output of the PRBS checker to determine if application of the pre-defined error data flow to the data input of the PRBS checker causes the expected error event. If the expected error event is in fact detected at the out-of-sync event output of the PRBS checker, the end-of-test controller and monitor provides an indication, not explicitly shown in FIG. 2, that the test has passed. On the other hand, if the expected error event is not detected at the out-of-sync event output of the PRBS checker, the end-of-test controller and monitor provides an indication, also not explicitly shown in FIG. 2, that the test has failed. In the latter situation, the failure may be due, for example, to the PRBS checker having lost its clock signal.

As noted previously, such a failure can cause an in-sync event to be reported even when there are errors in the received PRBS signal. This embodiment avoids that problem by providing the complementary end-of test check in which the multiplexer 210 supplies the pre-defined error flow to the data input of the PRBS checker 206 under the control of the end-of-test controller and monitor 212. Also, in this embodiment the PRBS checker does not include an in-sync event output, but instead includes only a single error event output, namely, the out-of-sync event output. Thus, the complexity of the output interface between the PRBS checker and related external processing circuitry is reduced by a factor of two, leading to improved processing efficiency and reduced system cost.

Elements 102, 206, 210 and 212 in the FIG. 2 embodiment may be viewed individually or collectively as examples of what is more generally referred to herein as "PRBS circuitry." As indicated previously, such PRBS circuitry may include conventional elements typically found in PRBS circuitry, such as the above-noted LFSRs, buffer circuits, clock recovery circuits, processors, memory, etc.

Although shown as separate from the PRBS checker 206 in the FIG. 2 embodiment, the control circuitry comprising elements 210 and 212 may alternatively be implemented internal to a given modified PRBS checker. Such an implementation may be viewed as collectively comprising a conventional PRBS checker with associated control circuitry. Thus, the data input and error event output referred to above need not necessarily be external inputs and outputs, but may instead be internal inputs and outputs of a modified PRBS checker.

The PRBS circuitry as illustrated in FIGS. 1 and 2 may include other elements in addition to or in place of those specifically shown, including one or more elements of a type commonly found in a conventional implementation of such circuitry. These and other conventional elements, being well understood by those skilled in the art, are not described in detail herein. It should also be understood that the particular arrangements of elements shown in FIGS. 1 and 2 are presented by way of illustrative example only. More specifically, as previously indicated, the invention can be implemented using many types of PRBS circuitry, and is not limited to any particular PRBS circuitry configuration. Those skilled in the art will recognize that a wide variety of other PRBS circuitry configurations may be used in implementing the invention.

Figure 3:
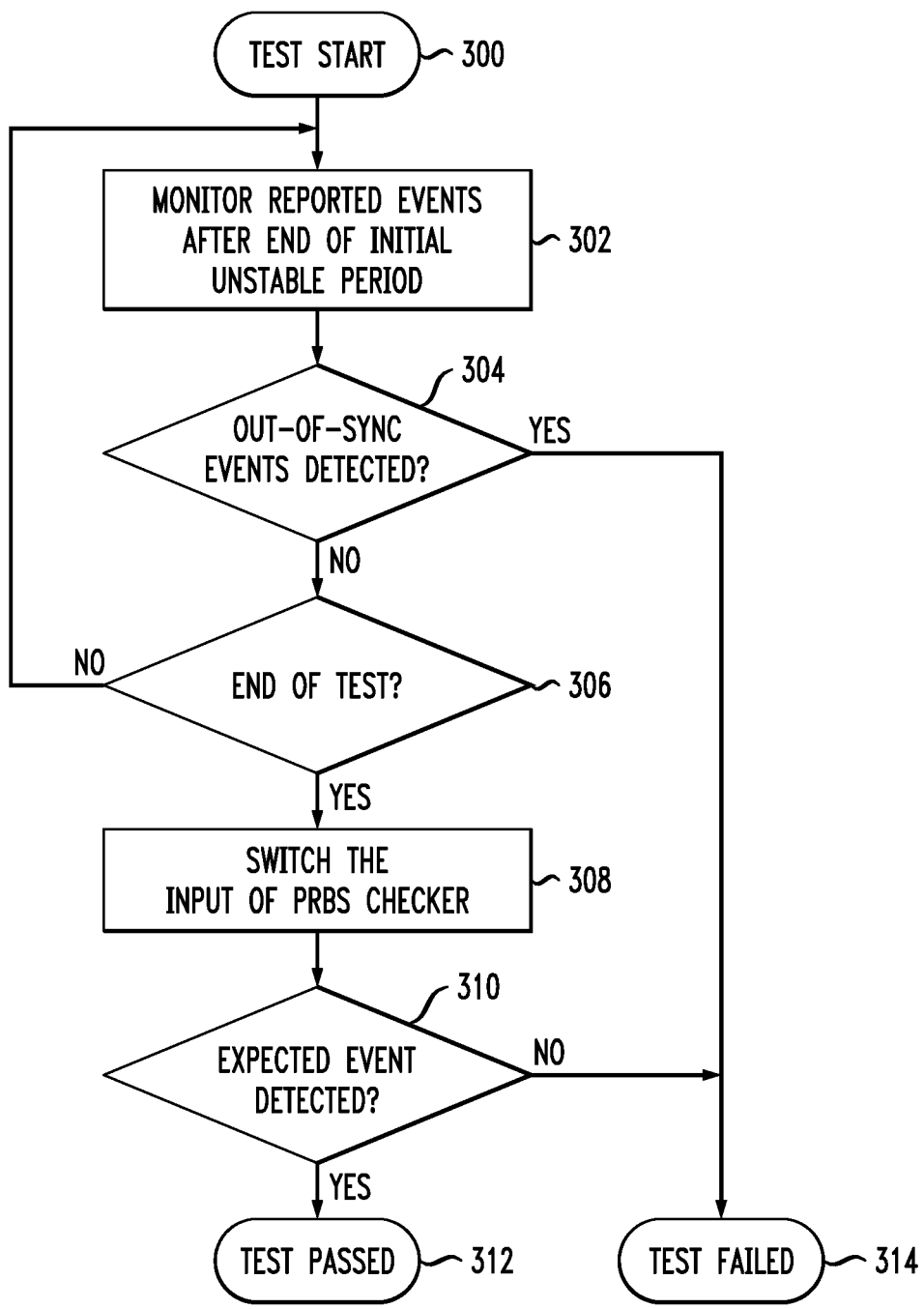
FIG. 3 is a flow diagram of a PRBS checking process implemented in the FIG. 2 system.

FIG. 3 is a flow diagram illustrating in greater detail the operation of a PRBS checking process implemented in the system 200. The PRBS checking process is shown as comprising steps 300 through 314, which are implemented primarily using the control circuitry comprising multiplexer 210 and end-of-test controller and monitor 212 of FIG. 2.

In step 300, a test is started. This will generally involve the PRBS generator 102 sending PRBS data and an associated clock to the design under test 104. The clock signal from the design under test is applied to a clock input of the PRBS checker 206. The PRBS data from the design under test 104 is applied to a first input of the multiplexer 210. The multiplexer is configured under control of the end-of-test controller and monitor 212 to supply this PRBS data to the data input of the PRBS checker.

In step 302, reported events are monitored after the end of an initial unstable period. As indicated elsewhere herein, it can take a certain amount of time for the PRBS data to stabilize and the PRBS checker to reach a stable operating state, during which time the event output of the PRBS checker may be frequently triggered. Step 302 involves monitoring reported error events in the end-of-test controller and monitor 212 after this initial period of instability following start of the test has ended.

In step 304, a determination is made as to whether or not any out-of-sync events have been detected subsequent to the end of the initial unstable period. If any such events have been detected, the process moves to step 314 to indicate that the test failed. If no such events have been detected, the process moves to step 306.

The detection of out-of sync events in step 304 is an example of a determination as to whether or not the test has met its in-test passage criteria. In this embodiment, for the test to pass, there must be an absence of out-of-sync events from the end of the initial unstable period to the completion of the test. Thus, if at least one out-of-sync event is detected in step 304, the in-test passage criteria are not met, and the test will fail as indicated in step 314. However, as will be described, the test can still fail even if the test has met its in-test passage criteria. In other embodiments, other types of in-test passage criteria may be used.

In step 306, a determination is made as to whether or not the test started in step 300 has ended. This determination may be made responsive to an end-of-test indicator received from the PRBS checker 206, or may be made using other techniques. If the test has ended, the process moves to step 308. If the test has not ended, the process returns to step 302 to continue monitoring error events reported by the PRBS checker.

In step 308, the input of the PRBS checker 206 is switched from the PRBS data to the pre-defined error data flow via the multiplexer 210 under the control of the end-of-test controller and monitor 212. This is expected to cause the PRBS checker 206 to report an out-of-sync event if the PRBS checker is in its in-sync state before the switching of the input occurs. The process then proceeds to step 310.

In step 310, a determination is made as to whether or not the expected error event has occurred. In the present embodiment, the expected error event is an out-of-sync error event that is expected given that the PRBS data has been replaced with a predetermined error signal, namely the pre-defined error data flow. If the expected error event is detected in step 310, the process moves to step 312 to indicate that the test passed. Otherwise, the process moves to step 314 to indicate that the test failed.

Advantageously, the FIG. 3 process ensures that the PRBS checker is not stuck in its in-sync state due to loss of clock. For example, in a typical implementation of the process, the event interface of the PRBS checker may be silent for a long period of time following the end of the initial unstable period. This period of time may be on the order of minutes or hours. If after the switching of the data input in step 308, the expected out-of-sync error event is observed in step 310, one can reasonably conclude that there were no errors in the PRBS stream in the long period of time following the end of the initial unstable period. Thus, even if the clock signal has been lost, this condition will be detected because the expected out-of-sync event will not be observed, since the PRBS checker will be stuck in its in-sync state.

The end-of-test check described in conjunction with FIGS. 2 and 3 also allows the output event interface of the PRBS checker to be simplified. For example, in the embodiments described above, the PRBS checker need only include an out-of-sync event output. The in-sync event output can be eliminated. Thus, the output event interface of the PRBS checker is reduced from a two-event interface to a single-event interface, which reduces the complexity and cost of the system. This also reduces the frequency of event reporting, and can therefore also improve system performance. For example, dynamic power consumption is generally a function of the frequency of event reporting, and is therefore expected to be significantly reduced in the FIG. 2 embodiment relative to the FIG. 1 embodiment.

It should be noted that the particular process steps shown in FIG. 3 are presented by way of illustrative example only, and other embodiments may utilize different types and sequences of process steps.

Also, the process or portions thereof may be implemented in the form of software that is stored in a memory of testing system and executed by a processor of the testing system. Such a memory may be viewed as an example of what is more generally referred to herein as a "computer-readable storage medium" comprising executable program code.

The PRBS circuitry of FIG. 2 may be implemented as part of a testing system as previously described. Such a testing system may be a stand-alone system such as a testing platform for testing of telecommunications devices, integrated circuits, or other types of electronic devices. Alternatively, portions of the PRBS circuitry may be embedded in the devices themselves, such as in a device or other node of a telecommunication system, or in an integrated circuit device. Examples of such arrangements will now be described with reference to FIGS. 4 and 5.

Figure 4:
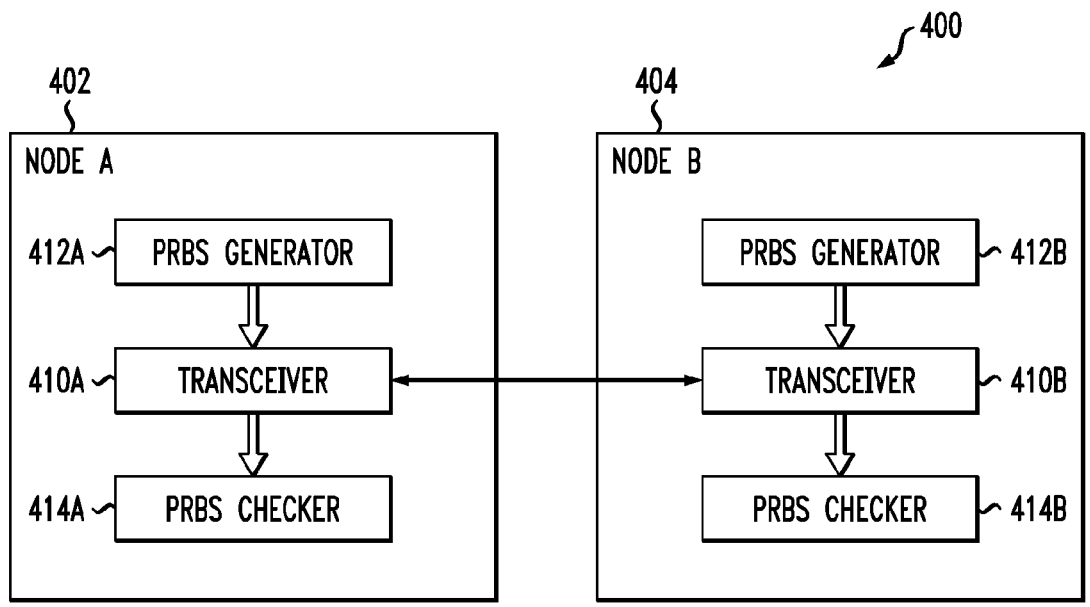
FIGS. 4 and 5 show respective telecommunication system and integrated circuit applications of the PRBS circuitry illustrated in FIG. 2.

FIG. 4 shows PRBS circuitry implemented in nodes of a telecommunication system 400. The system includes two nodes 402 and 404, also denoted as Node A and Node B. Bidirectional communication between these two nodes is supported using respective transceivers 410A and 410B. Each of the nodes also includes PRBS circuitry including PRBS generator 412A, 412B and PRBS checker 414A, 414B. Although not explicitly shown in this figure, it is assumed that each of the PRBS checkers 414A, 414B also includes associated control circuitry comprising multiplexer 210 and end-of-test controller and monitor 212 for providing an end-of-test check capability as previously described in conjunction with FIGS. 2 and 3. As mentioned above, such control circuitry may be implemented within a modified PRBS checker in other embodiments.

Various tests can be carried out in the telecommunication system 400 using the PRBS circuitry of the two nodes. For example, a PRBS signal generated by generator 412A in Node A can be checked by the PRBS checker 414B in Node B. Similarly, a PRBS signal generated by generator 412B in Node B can be checked by the PRBS checker 414A in Node A. It is also possible that a test can be run within just a given node. For example, a PRBS signal generated by generator 412A in Node A can be checked by the PRBS checker 414A in Node A. Use of the end-of-test check implemented using the above-described control circuitry improves the operation of such tests while also simplifying the system.

Figure 5:
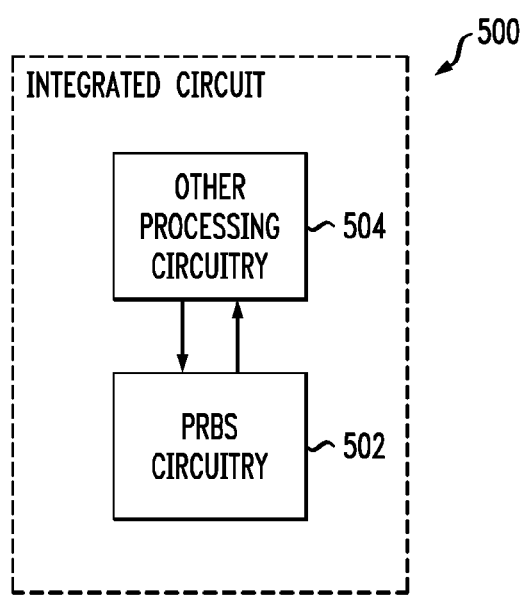

FIG. 5 shows an integrated circuit 500 that incorporates PRBS circuitry 502 of the type previously described in conjunction with FIG. 2. The PRBS circuitry, which may include PRBS generator 102, PRBS checker 206 and control circuitry comprising elements 210 and 212, is utilized to test other processing circuitry 504 of the integrated circuit 500. In other embodiments, the PRBS circuitry implemented in the integrated circuit may comprise only the PRBS checker 206 and the associated control circuitry 210, 212. As mentioned above, such an arrangement may be viewed as a modified PRBS checker comprising a conventional PRBS checker and incorporating the control circuitry.

The portions of the integrated circuit 500 shown in FIG. 5 may be part of a larger integrated circuit device, such as a microprocessor, central processing unit (CPU), digital signal processor (DSP), application-specific integrated circuit (ASIC), or other type of processor or integrated circuit device.

In an integrated circuit implementation of the invention, multiple integrated circuit dies are typically formed in a repeated pattern on a surface of a wafer. Each such die may include a device comprising PRBS circuitry as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of PRBS circuitry, including PRBS generators, PRBS checkers, switching elements, control logic elements, processing elements and other circuit elements for implementing the described functionality. Also, the particular types of end-of-test conditions or other PRBS checker conditions that are detected to control switching between operating states can be varied in other embodiments. These and numerous other alternative embodiments within the scope of the following claims will be apparent to those skilled in the art.

What is claimed is:

1. An apparatus comprising:
   a pseudorandom binary sequence (PRBS) checker having a data input and an error event output; and
   control circuitry coupled between the error event output and the data input of the PRBS checker;
   the control circuitry being configured to switch between a first operating state in which a received PRBS signal from a design under test is applied to the data input of the PRBS checker and a second operating state in which an error signal is applied to the data input of the PRBS checker, responsive to detection of a designated condition of the PRBS checker, wherein the error signal is applied to the data input of the PRBS checker independent of a PRBS signal from the design under test.

2. The apparatus of claim 1 wherein the control circuitry comprises:

a switching element having a first input adapted to receive the PRBS signal, a second input adapted to receive the error signal, and an output coupled to the data input of the PRBS checker; and control logic having an input coupled to the error event output of the PRBS checker and an output coupled to a control input of the switching element.

3. The apparatus of claim 2 wherein the switching element comprises a multiplexer.

4. The apparatus of claim 1 wherein the control circuitry is configured to switch between the first operating state and the second operating state responsive to detection of an end-of-test condition of the PRBS checker.

5. The apparatus of claim 4 wherein the end-of-test condition indicates that the PRBS checker has completed a test involving the received PRBS signal.

6. The apparatus of claim 4 wherein the control circuitry is configured to detect the end-of-test condition by detecting an end-of-test indicator generated external to the PRBS checker.

7. The apparatus of claim 1 wherein the control circuitry is configured to indicate that a test involving the received PRBS signal has passed if: the test has met its in-test passage criteria; and subsequent to completion of the test, an expected error event is detected at the error event output of the PRBS checker after the control circuitry has switched from the first operating state to the second operating state.

8. The apparatus of claim 1 wherein the control circuitry is configured to indicate that a test involving the received PRBS signal has failed if: the test has met its in-test passage criteria; and subsequent to completion of the test, an expected error event is not detected at the error event output of the PRBS checker after the control circuitry has switched from the first operating state to the second operating state.

9. The apparatus of claim 1 wherein the error event output of the PRBS checker comprises an out-of-sync event output which is the only event output of the PRBS checker.

10. The apparatus of claim 1 wherein the PRBS checker does not include an in-sync event output.

11. The apparatus of the claim 1 wherein the PRBS checker comprises only a single error event output.

12. The apparatus of claim 1 wherein the PRBS checker and the control circuitry are implemented in a node of a telecommunication system.

13. The apparatus of claim 1 wherein at least one of the PRBS checker and the control circuitry are implemented in an integrated circuit.

14. An integrated circuit comprising the PRBS checker and the control circuitry of claim 1.

15. A method comprising the steps of:
applying a received PRBS signal from a design under test to a data input of a PRBS checker;
detecting a designated condition of the PRBS checker; and
responsive to detection of the designated condition, applying an error signal to the data input of the PRBS checker, wherein the error signal is applied to the data input of the PRBS checker independent of a PRBS signal from the design under test.

16. The method of claim 15 wherein the step of detecting a designated condition of the PRBS checker comprises detecting an end-of-test condition indicating that the PRBS checker has completed a test involving the received PRBS signal.

17. The method of claim 15 further including the steps of:
determining if an expected error event occurs after the error signal is applied to the data input of the PRBS checker;
if the expected error event occurs and a test involving the received PRBS signal has met its in-test passage criteria, generating an indication that the test has passed; and
if the expected error event does not occur, generating an indication that the test has failed even if the test has met its in-test passage criteria.

18. The method of claim 17 wherein the expected error event comprises an out-of-sync event.

19. The method of claim 15, wherein the method is implemented by a computer-readable storage medium comprising executable program code.

20. A testing system comprising:
a pseudorandom binary sequence (PRBS) generator configured to generate a PRBS signal for transmission to a design under test;
a PRBS checker configured to receive the PRBS signal from the design under test and having a data input and an error event output; and
control circuitry coupled between the error event output and the data input of the PRBS checker;
the control circuitry being configured to switch between a first operating state in which the received PRBS signal is applied to the data input of the PRBS checker and a second operating state in which an error signal is applied to the data input of the PRBS checker, responsive to detection of a designated condition of the PRBS checker, wherein the error signal is applied to the data input of the PRBS checker independent of a PRBS signal from the design under test.

21. The apparatus of claim 1, wherein the error signal is predetermined and not dependent on the error event output of the PRBS checker.

* * * * *